United States Patent
Keegan et al.

(10) Patent No.: US 7,199,582 B2
(45) Date of Patent: Apr. 3, 2007

(54) SEGMENTED ACCELERATION SENSITIVE CINE MRI

(75) Inventors: Jennifer Keegan, London (GB); David Firmin, London (GB)

(73) Assignee: Royal Brompton & Harefield NHS Trust, London (GB)

( * ) Notice: Subject to any disclaimer, the term of this patent is extended or adjusted under 35 U.S.C. 154(b) by 22 days.

(21) Appl. No.: 10/489,986

(22) PCT Filed: Sep. 17, 2002

(86) PCT No.: PCT/GB02/04222

§ 371 (c)(1),
(2), (4) Date: Aug. 5, 2004

(87) PCT Pub. No.: WO03/025611

PCT Pub. Date: Mar. 27, 2003

(65) Prior Publication Data

US 2005/0065428 A1    Mar. 24, 2005

(30) Foreign Application Priority Data

Sep. 17, 2001    (GB) .............................. 0122405.4

(51) Int. Cl.
*G09V 3/00*    (2006.01)
(52) U.S. Cl. .................................................. 324/309
(58) Field of Classification Search ............... None
See application file for complete search history.

(56) References Cited

U.S. PATENT DOCUMENTS

| | | | | |
|---|---|---|---|---|
| 5,093,620 A | * | 3/1992 | Pelc et al. | 324/306 |
| 5,101,156 A | * | 3/1992 | Pelc | 324/306 |
| 5,204,625 A | * | 4/1993 | Cline et al. | 324/306 |
| 5,438,992 A | * | 8/1995 | Siegel et al. | 600/419 |
| 6,031,374 A | * | 2/2000 | Epstein et al. | 324/306 |
| 6,259,940 B1 | | 7/2001 | Bernstein et al. | |
| 6,393,313 B1 | * | 5/2002 | Foo | 600/410 |
| 6,806,709 B2 | * | 10/2004 | Markl et al. | 324/309 |

OTHER PUBLICATIONS

Keegan, J. et al., "Breath-hold Signal Loss Sequence for the Qualitative Assessment of Blood Flow Disturbances in Cardiovascular MR", Proceedings of the International Society for Magnetic Resonance in Medicine, Tenth Scientific Meeting and Exhibition, May 18-24, 2002, conferences abstract.

(Continued)

*Primary Examiner*—Brij Shrivastav
*Assistant Examiner*—Dixomara Vargas
(74) *Attorney, Agent, or Firm*—Daly, Crowley, Mofford & Durkee, LLP

(57) ABSTRACT

Conventional gradient echo sequences with relatively long echo-times visualise complex flow as signal loss, the degree and extent of which is a qualitative indicator of valvular heart disease. Since the long echo-time precludes segmentation, breath-hold imaging is not possible and acquisitions typically take 2-minutes with respiratory motion artefact being a frequent problem. In the present invention, a segmented sequence is used which generates similar degrees of signal loss to a conventional gradient echo sequence. However, the acquisition duration is reduced and breath-hold imaging is feasible, removing respiratory motion artefact.

6 Claims, 3 Drawing Sheets

(a) velocity sensitised (b) acceleration sensitised

OTHER PUBLICATIONS

Foo, T.K.F., et al., "Improved Ejection Fraction and Flow Velocity Estimates with Use of View Sharing and Uniform Repetition Time Excitation with Fast Cardiac Techniques", Radiology, May 1995, vol. 195, No. 2, pp. 471-478.

Westenberg, J.J.M., et al., MRA Stenosis Quantification in Flow Phantoms and Renal Arteries, Proceedings of the International Society for Magnetic resonance in Medicine, Sixth Scientific Meeting and Exhibition, Apr. 18-24, 1998, vol. 2, p. 832, conference abstract.

International Search Rpt of PCT/GB02/04222 dated Mar. 4, 2003.

Forster, J. et al., "Fast Acceleration-encoded Magnetic Resonance Imaging", Medical Physics, Jan. 2001, vol. 28. No. 1, pp. 28-35.

Keegan, J. et al., "The Application of Breath Hold Phase Velocity Mapping Techniques To The Measurement of Coronary Artery Blood Flow Velocity: Phantom Data And Initial In Vivo Results" Magnetic Resonance Medicine, May 1, 1995, vol. 31, No. 5, pp. 526-536.

* cited by examiner

SEGMENTED ACCELERATION SENSITIVE CINE MRI

CROSS-REFERENCE TO RELATED APPLICATIONS

This application is a National Stage application of PCT Application No. PCT/GB02/04222, filed on Sep. 17, 2002, and claims the benefit of GB Application No. 0122405.4, filed on Sep. 17, 2001, both of which are incorporated herein by reference.

The present invention relates to magnetic resonance (MR) imaging, and in particular to an improved imaging technique which enables more useful results to be obtained from imaging a patient.

As is well known, MR imaging (MRI) is a useful diagnostic tool which enables analysis of internal structures and flows within a patient's body in non-invasive manner. In general terms, radio frequency waves are applied to a patient's body in a region of changing magnetic field and the molecules within the patient's body are caused to resonate at various frequencies which can be detected. The detected resonances are processed to enable imaging of internal structures, etc.

In general terms, the magnetic field is caused to alter in a number of different ways for different purposes in the imaging process. In particular a number of variations are superimposed onto a large underlying magnetic field which is caused to exist in the vicinity of the test volume.

Firstly, a 'slice select' magnetic field is applied such that the magnitude of the magnetic field changes along a first direction in a known manner. Generally this direction is considered to be along the length of the patient's body when present in the test volume. However, this is not necessarily the case. The purpose of this field is apparent when it is considered what happens when a radio frequency signal is applied in the test volume. The resonant frequency of nuclei in the patient's body depends upon the magnitude of the magnetic field around them. Accordingly, for a given frequency of applied radio frequency signal, the slice select field determines in which plane orthogonal to the first direction nuclei will be excited. Accordingly, this field can be said to select which 'slice' through a patient is excited by the application of the radio frequency energy pulse.

The excitation of the nuclei persists for a time after the application of the energy pulse, and during that time, measurements of the excitations in the excited plane can be made. The time between the application of the energy pulse and the measurement is usually designated TE. These measurements are made by a further coil placed near to the patient which picks up electromagnetic signals from the oscillations of the nuclei.

As part of that reading process, a second magnetic field gradient is applied in a second direction orthogonal to the first direction. The second direction therefore lies in the plane of the selected slice. The changing magnetic field along one direction in the plane of the slice changes the frequency response of the nuclei. The picked up signal in the coil therefore includes a mixture of frequencies, which can be analysed by Fourier analysis or the like to determine the magnitude of the responses at different locations in the second direction within the selected slice. This direction is known as the frequency encode direction.

A third magnetic field gradient is applied in a third direction orthogonal to both of said first and second directions and is known as the phase encoding gradient. This enables the locations of the resonant responses to be determined in the third direction within the selected slice, and so a full three dimensional picture of the resonant responses can be established.

One common use of MRI is in imaging of hearts and blood flows through the heart which can be useful in the diagnosis and assessment of patients with different kinds of conditions of the heart. In the context of imaging blood flows, and organs such as the heart which have a blood through them, various techniques are well known to try to compensate for the additional effects which the blood flow has on the imaging by virtue of its movement. It is for instance well known to have velocity or acceleration compensated imaging schemes.

Also, when imaging hearts, account has to be taken of the fact that the heart is constantly moving, and so it is well known to build up the final image from readings taken during a number of sequential cardiac cycles. It is possible to build up an image by taking a single phase encoding in each cardiac cycle. This however takes a significant of cardiac cycles (in excess of 100) to achieve a complete image. This leads to the further complication that additional movement of the heart is introduced by the breathing of the patient as the lungs are adjacent to the heart. This has in the past been addressed by the use of techniques which enable multiple phase encoding steps to be done in each cardiac cycle, thus reducing the number of cardiac cycles (to less than 20) required to build up an image of a particular resolution. In particular it is possible to reduce the number of cardiac cycles necessary to build up an image such that it becomes feasible to ask the patient to hold their breath for the duration of the imaging process, thereby minimising the respiratory artefacts in the image. This technique is known as segmented imaging, interleaved imaging, or breath-hold imaging.

The above outlined aspects of MRI are well known and the above is not intended to be exhaustive. For further background understanding, reference may be made to any standard paper on the subject or to earlier patent applications in this field, for instance those of the present inventors.

In cardiovascular MR, velocity compensated gradient echo sequences with relatively long echo-times of around 15 ms have been shown to exhibit signal loss in areas of complex flow such as those found in stenotic and regurgitant jets (see for instance 'Valve and great vessel stenosis: assessment with CMR jet velocity mapping' Radiology 1991; 178: 229, Kilner P J, Firmin D N, Rees R S O et al). Although not directly related to the severity of stenosis or to other pathology, the degree and extent of signal loss has proved to be a qualitative indicator of valvular heart disease and can also aid in the positioning of further imaging planes for quantitative analysis with phase velocity mapping ('Diagnostic accuracy and estimation of the severity of valvular regurgitation from the signal void on cine magnetic resonance imaging' Am Heart J 1989; 118: 760–7, Wagner 5, Auffermann W, Buser P et al.).

Due to the requirement for a long echo time however, such a sequence cannot be segmented to allow breath-hold imaging and studies typically take approximately 2-minutes to acquire with respiratory motion artefact being a frequent problem.

True FISP cine imaging has also been shown to exhibit signal loss in regions of complex flow and has the advantage that the acquisition may be performed during a period of breath-holding. However, the pattern of signal loss with true FISP is different from that obtained with a conventional sequence and appears not to delineate the extended region of complex flow around the stenotic or regurgitant jet (see for instance Kilner P J, John A, Lorenz C et al. In Proceedings of the 4th annual meeting of the Society of Cardiovascular Magnetic Resonance 2001, Atlanta, p77. In addition, true PISP is less robust than spoiled gradient echo imaging and has a high sensitivity to field inhomogeneities and shimming errors.

The present invention provides a method of performing magnetic resonance imaging comprising applying a segmented gradient echo sequence with acceleration sensitivity and velocity compensation to a body to be imaged.

In an alternative arrangement, the invention provides a method of performing magnetic resonance imaging comprising applying a segmented gradient echo sequence with velocity sensitivity to a body to be imaged.

The present invention thus provides an imaging technique which results in a degree of signal loss similar to that obtained with a conventional sequence whilst allowing the entire acquisition to be performed in the duration of a single breath-hold.

It is an advantage of the invention, shown particularly in the first aspect of the invention mentioned above, that signal losses are introduced into high speed imaging operations which correspond to the losses previously caused by turbulent flows and seen in lower speed imaging processes.

The invention will be better understood from the following description, given by way of example, of embodiments of the invention, which should be read in conjunction with the attached Figures, in which.

Figure 2:
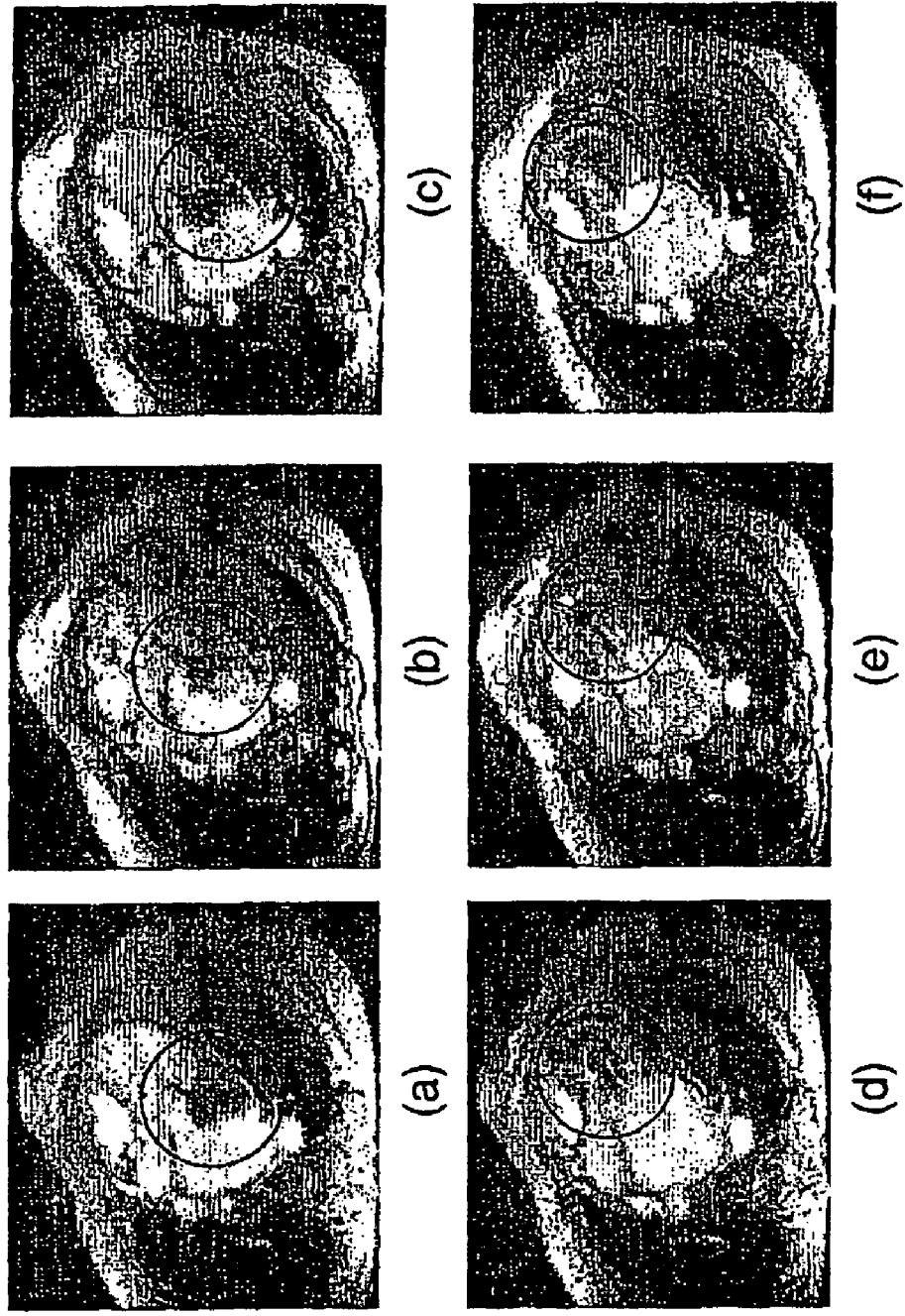
Figure 3:
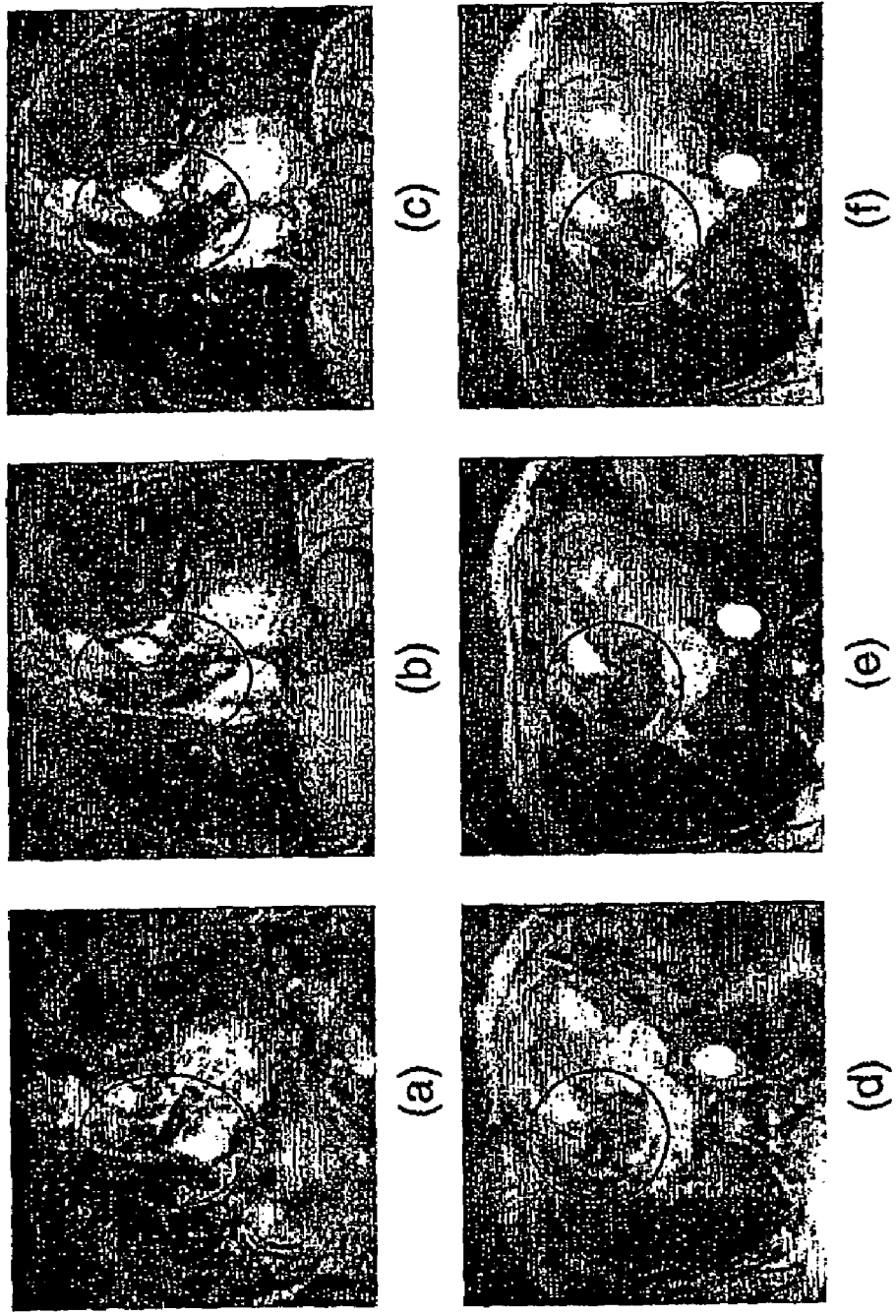

FIG. 2 illustrates systolic and diastolic frames from cine datasets acquired using a conventional TE14 sequence ((a) and (d)), the breath-hold velocity sensitised sequence ((b) and (e)) and the breath-hold acceleration sensitised sequence ((c) and (f)) in a patient with mitral regurgitation and stenosis; and FIG. 3 illustrates systolic frames from oblique coronal and LVOT cine datasets acquired using a conventional TE14 sequence ((a) and (d)), the breath-hold velocity sensitised sequence ((b) and (e)) and the breath-hold acceleration sensitised sequence ((c) and (f)) in a patient with aortic regurgitation.

Conventional gradient echo sequences with relatively long echo-times visualise complex flow as signal loss, the degree and extent of which is a qualitative indicator of valvular heart disease. Since the long echo-time precludes segmentation, breath-hold imaging is not possible and acquisitions typically take 2-minutes with respiratory motion artefact being a frequent problem. In the present invention, a segmented sequence is used which generates similar degrees of signal loss to a conventional gradient echo sequence. However, the acquisition duration is reduced and breath-hold imaging is feasible, removing respiratory motion artefact.

Both velocity and acceleration sensitised sequences were developed and compared with a conventional sequence in 8 patients with flow disturbances and in 4 healthy subjects. The image quality of both breath-hold sequences was significantly better than that of the conventional sequence ($p<0.01$). In addition, the image quality achieved with the acceleration sensitised sequence was significantly better than that achieved with the velocity sensitised sequence ($p<0.01$) where artefact from beat-to-beat variations in blood flow velocities was a frequent problem It is concluded that signal loss in complex flow is best demonstrated using the breath-hold acceleration sensitised sequence where the signal from both stationary and constant velocity material is rephased at the echo-time.

This invention was developed using a Siemens Sonata scanner equipped with gradients having a peak strength of 40 mT/m and a peak slew rate of 200 mT/m/ms on each axis independently.

Figure 1:
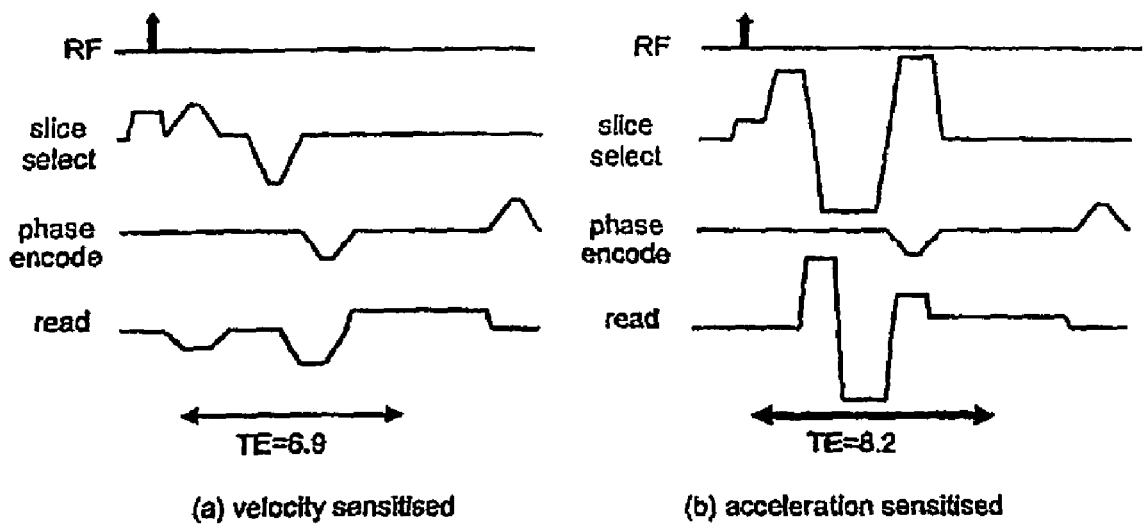
FIG. 1(a) illustrates velocity sensitised (a) sequences for the qualitative assessment of signal loss.
FIG. 1(b) illustrates acceleration sensitised sequences for the qualitative assessment of signal loss.

Two sequences were developed, as shown in FIG. 1, both of which were based on a simple segmented gradient echo sequence. In the first (a), velocity sensitivity was introduced with the addition of a bi-polar gradient in both the slice select and frequency encoding (read) directions. Phantom and initial patient studies enabled the velocity sensitivity in both directions to be empirically adjusted to give a similar degree and extent of signal loss as a conventional gradient echo sequence with an echo-time (TE) of 14 ms and velocity compensation in both slice-select and frequency encoding directions.

In the second sequence (b), the gradient waveforms in the slice-select and frequency encoding (read) directions were modified to give an acceleration sensitivity, whilst maintaining velocity compensation at the centre of the echo readout. This involved the addition of extra gradient lobes between the slice selection and signal readout (see, for example, 'The application of phase shifts in NMR for flow measurement' Magn Reson Med 1990;14: 230–41; Firmin D N, Nayler G L, Kilner P J, Longmore D M), the timing and magnitude of which were such that the phase shifts due to acceleration in both directions were equal to those introduced by the conventional TE14 sequence.

The echo times of the sequences developed in (a) and (b) were 6.9 ms and 8.2 ms respectively. Breath-hold segmented k-space acquisitions with 7 views per segment and temporal view-sharing (15) enabled the acquisition of cine data with effective temporal resolutions of 45 ms and 50 ms respectively over 18 cardiac cycles. All studies were performed with a 350 mm FOV and 6 mm slice thickness and an acquisition matrix of 256×128.

In order to assess the effectiveness of the techniques outlined above, conventional TE14, breath-hold velocity sensitised and breath-hold acceleration sensitised acquisitions were performed in 4 healthy volunteers (mean age 28 years, range 25–31 years) and in 8 patients (mean age 55 years, range 45–67 years) with flow disturbances, due to either valvular heart disease (N=5) or to coarctation (N=3). For each patient, following standard clinical protocols, the image plane was selected so as to best demonstrate the flow disturbance. In four of the patients, acquisitions with all three sequences were carried out in 2 image planes, resulting in a total of 12 studies available for comparison in the patient group. In the healthy volunteer group, acquisitions with all three sequences were performed in three image planes—the four-chamber view to demonstrate flow through the mitral and tricuspid valves, and also, the left and right ventricular outflow tract (LVOT and RVOT) views to demonstrate flow through the aortic and pulmonary valves respectively—resulting in a total of 12 studies being available for comparison.

The image quality of the cine data acquisitions were scored by two independent observers according to the presence of respiratory and blood flow artefact, with 0=no or minimal artefact, 1=minor artefact, 2=moderate artefact and 3=severe artefact. In cases of disagreement, a consensus opinion was reached. Friedman two-way analysis of variance was used to determine whether there were any significant differences in the image quality obtained with the conventional, the breath-hold velocity sensitised and the breath-hold acceleration sensitised sequences. If so, matched pairs Wilcoxon analysis (with Bonferroni correction for multiple testing) was performed to determine where the differences lay.

For all subjects studied, the conventional TE14, the breath-hold velocity sensitised and the breath-hold acceleration sensitised sequences produced similar degrees and extents of signal loss.

FIG. 2 is an example showing the results of using the sequences in a subject with mitral stenosis and regurgitation, the acquisitions being performed in the horizontal long axis plane, with the areas of interest in the images identified by the superimposed circles. Systolic frames, showing a regurgitant jet extending into the left atrium, are shown in (a)–(c) and diastolic frames, showing signal loss within the left ventricle, are shown in (d)–(f). FIGS. 2(a) and (d) show systolic and diastolic frames from the conventional TE14 sequence acquired over approximately 2 minutes. In this example, the image quality is good and respiratory motion has not noticeably degraded the image quality obtained. The corresponding cine frames from the velocity sensitised sequence of FIG. 1(a) are shown in FIGS. 2(b) and (e) and show a similar degree and extent of signal loss to the conventional sequence. However, although the images are free from respiratory motion artefact, they are degraded by artefacts from beat-to-beat variations in blood flow velocity which smear out in the phase encode direction. In contrast, FIGS. 2(c) and (f) which show the corresponding cine frames acquired with the acceleration sensitised sequence of FIG. 1(b), where constant velocity material is rephased at the centre of the echo readout, are of high quality and devoid of both respiratory motion and blood flow artefacts.

FIG. 3 shows the results of using these sequences in a patient with aortic regurgitation, with cine acquisitions having been made in both oblique coronal ((a)–(c)) and LVOT ((d)–(f)) planes, with the areas of interest identified as in FIG. 2. All of the images shown are systolic frames and show complex flow extending into the aorta. However, it is clear that, in this case, the images acquired with the conventional TE14 sequence are considerably degraded by respiratory motion artefact. Those acquired with the breath-hold velocity sensitive sequence ((b) and (e)) are devoid of respiratory motion artefact but artefact from constant velocity blood is present, although not to as great an extent as that in the patient shown in FIG. 2. The image quality obtained from using the acceleration sensitised sequence ((c) and (f)) are again superior.

The appearances observed in FIGS. 2 and 3 were similar for all subjects studied. Table 1 shows the mean image quality scores for the three sequences used in patient and healthy volunteer groups; both separately and combined:

|  | Conventional TE14 sequence | Breath-hold velocity sensitised sequence | Breath-hold acceleration sensitised sequence |
|---|---|---|---|
| Patients (12 studies) | 2.67 | 1.83 | 0.42 |
| Healthy Volunteers (12 studies) | 2.83 | 2.0 | 0.25 |
| Combined (12 studies) | 2.75 | 1.92 | 0.33 |

(Table 1 shows average image quality scores for cine acquisitions using the conventional TE14 sequence, the breath-hold velocity sensitised sequence (FIG. 1(a)) and the breath-hold acceleration sensitised sequence (FIG. 1(b)). (0=no or minimal artefact, 1=minor artefact, 2=moderate artefact and 3=severe artefact). Both breath-hold sequences gave significantly improved image quality compared to the conventional sequence (p<0.01) and the acceleration sensitised sequence gave significantly better image quality than the velocity sensitised one (p<0.01). This was true for the combined patient and healthy volunteer group and for the patient and healthy volunteer subgroups.)

The quality of the free-breathing TE14 acquisitions was frequently poor, with severe respiratory motion artefacts being often present. Although the image quality achieved with the breath-hold velocity sensitised sequence (FIG. 1(a)) was significantly better (mean image score 1.92 vs. 2.75, p<0.01), it was generally degraded by blood flow ghosting artefacts. In contrast, the image quality obtained using the acceleration sensitised sequence (FIG. 1(b)) was excellent and significantly better than both the conventional and the breath-hold velocity sensitised sequences (mean image quality score 0.33 vs. 2.75 and 1.92 respectively; both p<0.01). It is thought that variations in blood flow velocities from beat to beat can result in phase variations and associated ghosting artefacts (16, 17) when using the velocity sensitised sequence whereas high acceleration and other high orders of motion are only present in the region of highly complex flow where the resulting wide range of intra-voxel phase shifts tend to result in signal cancellation.

It will be seen then that this invention provides a segmented sequence which generates similar degrees of signal loss in complex flow to a conventional gradient echo sequence. By comparison, the acquisition duration is considerably reduced (for instance from 128 to 18 cardiac cycles, keeping the same imaging resolution) and breath-hold imaging is feasible, removing respiratory motion artefact. As discussed, one approach to generating signal loss is to add velocity sensitivity to a previously compensated sequence, as in FIG. 1(a), although in this case artefacts from flowing blood still degrade the images obtained (FIGS. 2 and 3, (b) and (d)). Signal loss is instead best generated by using the acceleration sensitised sequence shown in FIG. 1(b) where both stationary and constant velocity blood signal are rephased at the centre of the echo readout.

The invention claimed is:

1. A method of performing breath-hold magnetic resonance imaging on a body, the method comprising applying a segmented gradient echo sequence to the body with phase sensitivity to acceleration, and velocity compensation, on both the slice-select and frequency encoding axes, the acceleration sensitivity being such as to generate sufficient signal loss in response to complex flow in the body being imaged to enable a qualitative assessment of valvular heart disease to be made on the basis of an image acquired within the duration of a single breath-hold.

2. The method according to claim 1 comprising the steps of:
   applying a first gradient magnetic field to the region surrounding the body to be imaged;
   applying radio frequency energy to the body during the application of said first magnetic field whereby to cause nuclei in a designated slice of the body to resonate; and
   applying one or more second gradient magnetic fields to said body at a predetermined time after the application of said radio frequency energy, and detecting responses thereto, said responses being supplied for analysis and imaging of the body;

further comprising providing said acceleration sensitivity and said velocity compensation by altering the magnetic field around the body during the time interval between applying said radio frequency energy and applying said one or more second gradient magnetic fields.

3. The method according to claim 2 wherein said acceleration sensitivity and said velocity compensation are provided by applying one or more additional gradient magnetic fields corresponding to one or more of said first and second gradient magnetic fields to said body during said time interval.

4. A method of performing breath-hold magnetic resonance imaging on a body, the method comprising applying a segmented gradient echo sequence to the body with phase sensitivity to velocity on both the slice-select and frequency encoding axes, the velocity sensitivity being such as to generate sufficient signal loss in response to complex flow in the body being imaged to enable a ciualitative assessment of valvular heart disease to be made on the basis of an image acquired within the duration of a single breath-hold.

5. The method according to claim 4 comprising the steps of:

applying a first gradient magnetic field to the region surrounding the body to be imaged;

applying radio frequency energy to the body during the application of said first magnetic field whereby to cause nuclei in a designated slice of the body to resonate; and applying one or more second gradient magnetic fields to said body at a predetermined time after the application of said radio frequency energy, and detecting responses thereto, said responses being supplied for analysis and imaging of the body;

further comprising providing said velocity sensitivity by altering the magnetic field around the body during the time interval between applying said radio frequency energy and applying said one or more second gradient magnetic fields.

6. The method according to claim 5 wherein said velocity sensitivity is provided by applying one or more additional gradient magnetic fields corresponding to one or more of said first and second gradient magnetic fields to said body during said time interval.

* * * * *

UNITED STATES PATENT AND TRADEMARK OFFICE
CERTIFICATE OF CORRECTION

PATENT NO. : 7,199,582 B2
APPLICATION NO. : 10/489986
DATED : April 3, 2007
INVENTOR(S) : Keegan et al.

It is certified that error appears in the above-identified patent and that said Letters Patent is hereby corrected as shown below:

Col. 1, line 17, delete "in non-invasive" and replace with --in a non-invasive--.
Col. 1, line 27, delete "In particular a" and replace with -- In particular, a--.
Col. 2, line 28, delete "In particular it" and replace with -- In particular, it, --.
Col. 3, line 4, delete "PISP" and replace with --FISP--.
Col. 6, line 40, delete "case artefacts" and replace with --case, artefacts--.
Col. 7, line 22, delete "ciualitative" and replace with --"qualitative"--.

Signed and Sealed this

Fourteenth Day of August, 2007

JON W. DUDAS
*Director of the United States Patent and Trademark Office*